(12) United States Patent
Li et al.

(10) Patent No.: US 6,426,666 B1
(45) Date of Patent: Jul. 30, 2002

(54) DIODE-ASSISTED GATE TURN-OFF THYRISTOR

(75) Inventors: Yuxin Li, Santa Clara, CA (US); Alex Q. Huang, Blacksburg; Kevin Motto, Chester, both of VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 09/708,505

(22) Filed: Nov. 9, 2000

Related U.S. Application Data (60) Provisional application No. 60/164,555, filed on Nov. 10, 1999.

(51) Int. Cl.[7] .............................................. H03K 17/72
(52) U.S. Cl. ........................................ 327/438; 327/440
(58) Field of Search ................................ 327/377, 438, 327/440, 464, 471, 379, 502–504, 584, 585

(56) References Cited

U.S. PATENT DOCUMENTS

| | | | | |
|---|---|---|---|---|
| 4,581,542 A | * | 4/1986 | Steiherwald | 327/440 |
| 4,758,942 A | * | 7/1988 | Wada et al. | 363/135 |
| 5,237,225 A | * | 8/1993 | Gruning | 327/440 |
| 5,493,247 A | * | 2/1996 | Gruning | 327/443 |
| 5,777,506 A | * | 7/1998 | Kurachi et al. | 327/440 |

* cited by examiner

*Primary Examiner*—My-Trang Nu Ton
(74) *Attorney, Agent, or Firm*—Whitham, Curtis & Christofferson, P.C.

(57) ABSTRACT

A gate-controlled switch includes a gate turn-off thyristor in series with a diode. By using the diode in series with the GTO, the switch significantly increases the turn-off voltage that can be used for the current commutation. The unity turn-off gain and the snubberless turn-off capability are demonstrated.

16 Claims, 14 Drawing Sheets

DIODE-ASSISTED GATE TURN-OFF THYRISTOR

This application claims the benefit of provisional Application Serial No. 60/164,555, filed on Nov. 10, 1999, the contents of which is hereby incorporated by reference.

BACKGROUND OF THE INVENTION

1. Field of the Invention

This invention generally relates to gate-controlled switches, and more particularly to a gate turn-off thyristor which achieves enhanced performance through an improvement in turn-off current commutation.

2. Description of the Related Art

Gate turn-off (GTO) thyrisitor switches are the foundation of the high-power electronics industry. Structurally, GTO thyristors are four-layered, three-terminal silicon semiconductor devices which resemble a traditional thyristor in terms of performance but has the additional attribute that anode current can be turned off by control of its gate. Traditionally, a GTO's turn-off performance is limited by the slow gate current rising rate, and the turn-off is conducted with a turn-off gain (defined as $I_a/I_g$ at turn-off point) in the range of 3 to 5. Major drawbacks of the GTO include: 1) large gate control power due to the fact that the gate current has to be supplied for a long time; 2) slow switching speed due to long storage time; and 3) poor turn-off Safe Operation Area (SOA) due to non-uniform current distribution during turn-off. Because of the poor SOA problem, a GTO turn-off requires a dV/dt snubber, typically in the form of an R-C-D network. The RCD snubber is not only bulky, but also very lossy because each time the GTO turns on it will have to dissipate the energy stored in the snubber capacitor. The slow switching speed and high control power limits GTO's application in high frequency Pulse Width Modulation (PWM) converters.

In recent years, the turn-off performance of GTO thyristors has been significantly improved by turning it off at the unity-gain condition ($I_g=I_a$ at turn-off). By taking this approach, also known as hard-driven approach, the turn-off storage time has been shortened from typically several tens of microseconds to about one microsecond. The maximum turn-off current hence the SOA of these GTO thyristors has been significantly increased and the bulky and costly dv/dt snubber can be removed. High-power, hard-driven GTO thyristors can operate at frequencies of one kilohertz or above in a practical application system. See Motto et al. "The Emitter Turn-Off Thyristor (ETO) Based High Voltage, High Frequency Converter System," 1999 Center for Power Electronics Systems Annual Power Electronics Seminar, pages 340–345.

The condition known as unity gain turn-off corresponds to a situation where the cathode current is completely commutated to its gate before the end of the storage stage, or before the anode voltage increases. The essence of this is to break the PNPN latch-up mechanism, changing the GTO into an open-base PNP transistor mode during the turn-off transient. Typically, the GTO has a storage time of 1 microsecond under the unity gain turn-off condition. Therefore, the current commutating rate has to be very high (~anode current/1 μsec) for high-current GTOs.

Three major methods (devices) have been reported for operating GTOs in the unity turn-off gain condition. The first method was applied to an emitter turn-off (ETO) thyristor which made use of two switches to realize the high turn-off current commutation. During turn-off, its emitter switch $Q_E$ is turned off while the gate switch $Q_G$ is turned on. A voltage as high as the breakdown voltage of $Q_E$ can be applied on the gate loop stray inductor $L_G$, realizing fast current commutation. See Li et al., "Introducing the Emitter Turn-Off Thyristor (ETO)," IEEE Industry Applications Society 33rd Annual Meeting, Oct. 12–15, 1998, pages 860–864.

The second method was applied to a MOS turn-off (MTO) thyristor. This device was implemented using only a gate switch $Q_G$. During turn-off, the gate switch is turned on, bypassing the current through the GTO gate-cathode diode and realizing unity gain turn-off. See Piccone et al., "The MTO Thyristor—A new High Power Bipolar MOS Thyristor," IEEE Industry Applications Society 31st Annual Meeting, Oct. 6–10, 1996, pages 1472–1473.

The third method was applied to an integrated gate commutated thyristor (IGCT). This IGCT uses one voltage source and one gate switch. By dramatically decreasing the gate loop stray inductance, a high current commutation rate is achieved in the IGCT.

Each of the aforementioned devices has inherent limitations which degrade performance. The emitter switch of the ETO thyristor needs to conduct the main current, so it is implemented by paralleling many MOSFETs. The turn-off voltage for the current commutation in the MTO thyristor is less than the forward voltage drop of the GTO gate-cathode diode, so the current commutation rate is low.

Insofar as the IGCT is concerned, it is indisputable that the turn-off current commutation $di_G/dt$ is crucial to the performance of this type of device. As has been reported in the previously referenced Yamamoto article, even under the unity gain turn-off condition, higher commutation di/dt ensures a more uniform turn-off transient process over the entire GTO thyristor wafer. This, in turn, increases the turn-off capability of the device. Nevertheless, conventional IGCT devices remain limited by the turn-off loop stray inductance and the maximum turn-off voltage, the latter of which is typically about 20 V.

More specifically, in conventional IGCT devices a further increase of the turn-off current commutation $di_G/dt$ is difficult because of its gate loop stray inductance $L_G$ and the maximum available voltage source $V_{OFF}$ that can be used. For example, the gate loop stray inductance of a 4-inch IGCT has been reduced to 3 nH, which is considered to be very low and is even harder to decrease. The maximum gate turn-off voltage that can be applied to the IGCT has to be less than the breakdown voltage of the GTO's gate-cathode diode. Because this breakdown voltage is typically about 20 V, a maximum of about 6 kA/μsec commutating di/dt is achievable. See Yamamoto et al., "GCT (Gate Commutated Turn-Off) Thyristor and Gate Drive Circuit," PESC 1998, pages 1711–1715. The use of such a low maximum turn-off voltage has adversely affected the performance of the IGCT.

In view of the foregoing discussion, it is clear that a need exists for an improved gate turn-off thyristor which has fewer limitations than its conventional counterparts, and more specifically one in the form of an integrated gate commutated thyristor which operates based on a higher maximum turn-off voltage and thus with enhanced performance than conventionally possible in IGCT devices.

SUMMARY OF THE INVENTION

It is a first object of the present invention to provide a gate turn-off thyristor switch which has improved performance compared with conventional gate turn-off thyristor switches.

It is a second object of the present invention to achieve the first object by increasing the turn-off current commutation $di_G/dt$ to values above that achievable by conventional IGCT, ETO, and MTO devices.

The foregoing and other objects of the invention are achieved by providing a gate turn-off thyristor circuit which, in accordance with one embodiment, includes a gate turn-off thyristor connected to an anode, a diode connected in series with the gate turn-off thyristor and a cathode, a turn-off voltage source connected to the diode, and a gate loop stray inductance element connected between the turn-off voltage source and the gate turn-off thyristor. In this arrangement, the diode is a discrete diode. Its breakdown voltage may therefore be selected to be a very high value. This, in turn, allows for use of a high turn-off voltage $V_{off}$ to achieve a very high turn-off current commutation $di_G/dt$ which enables the GTO thyristor circuit of the present invention to achieve enhanced performance while maintaining a relatively simple circuit design. Also, the thyristor circuit of the present invention operates with equivalent performance as an integrated gate commutated thyristor in the aspect of unity turn-off gain, fast turn-off transient, and snubberless turn-off capability.

A second embodiment of the thyristor circuit of the present invention resembles the first embodiment except that a plurality of diodes are connected in parallel between the gate turn-off thyristor and a cathode terminal.

A third embodiment of the thyristor circuit of the present invention resembles the first embodiment except that a single diode wafer is packaged with the GTO inside the GTO's press-pak.

High current/power semiconductor devices are crucial to modern industry, and gate turn-off thyristors are the only practical candidate. The thyristor of the present invention significantly improves the performance of high-current GTOs, leading to improved power electronics and industry application. Furthermore, the invention is economically feasible to implement in terms of cost and ease of design.

DESCRIPTION OF THE PREFERRED EMBODIMENTS

The present invention is an improved gate turn-off thyristor circuit which has a higher turn-off current commutation $di_G/dt$ than conventional gate-controlled thyristors. This higher commutation is achieved by connecting at least one diode in series with a gate turn-off thyristor. The breakdown voltage of the diode is selected so that the breakdown voltage of the gate to cathode is increased above the conventional breakdown level, which is typically 20 volts. Because the new thyristor of the invention operates at a higher breakdown voltage, it is able to outperform conventional gate-controlled thyristors while simultaneously maintaining a very simple and economical design.

Principle of Operation

Figure 1A:
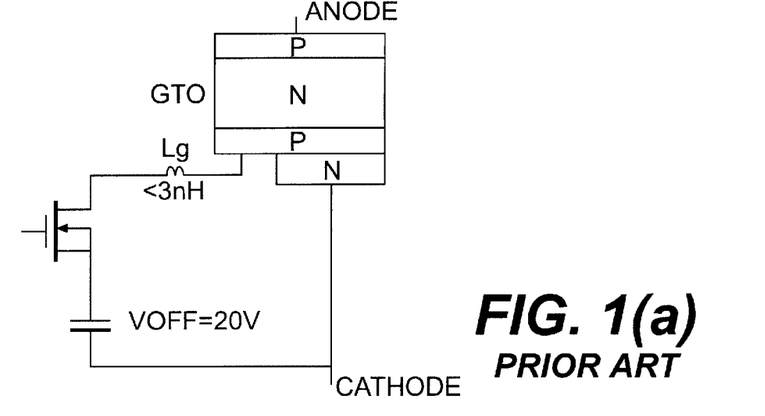
FIGS. 1(a), (b), and (c) show equivalent circuits for an integrated gate commutated thyristor, an emitter turn-off thyristor, and an MTO thyristor.
Figure 1B:
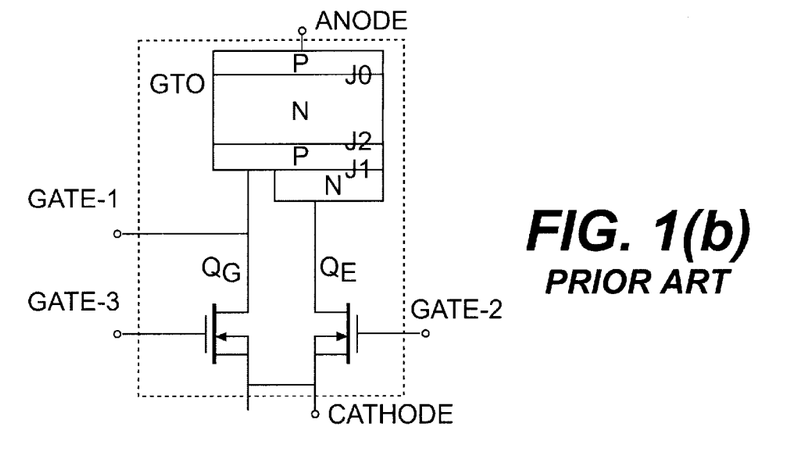
Figure 1C:
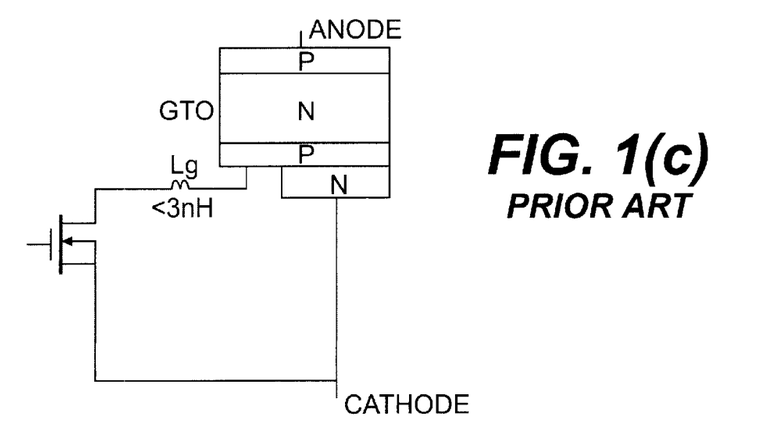
Figure 2:
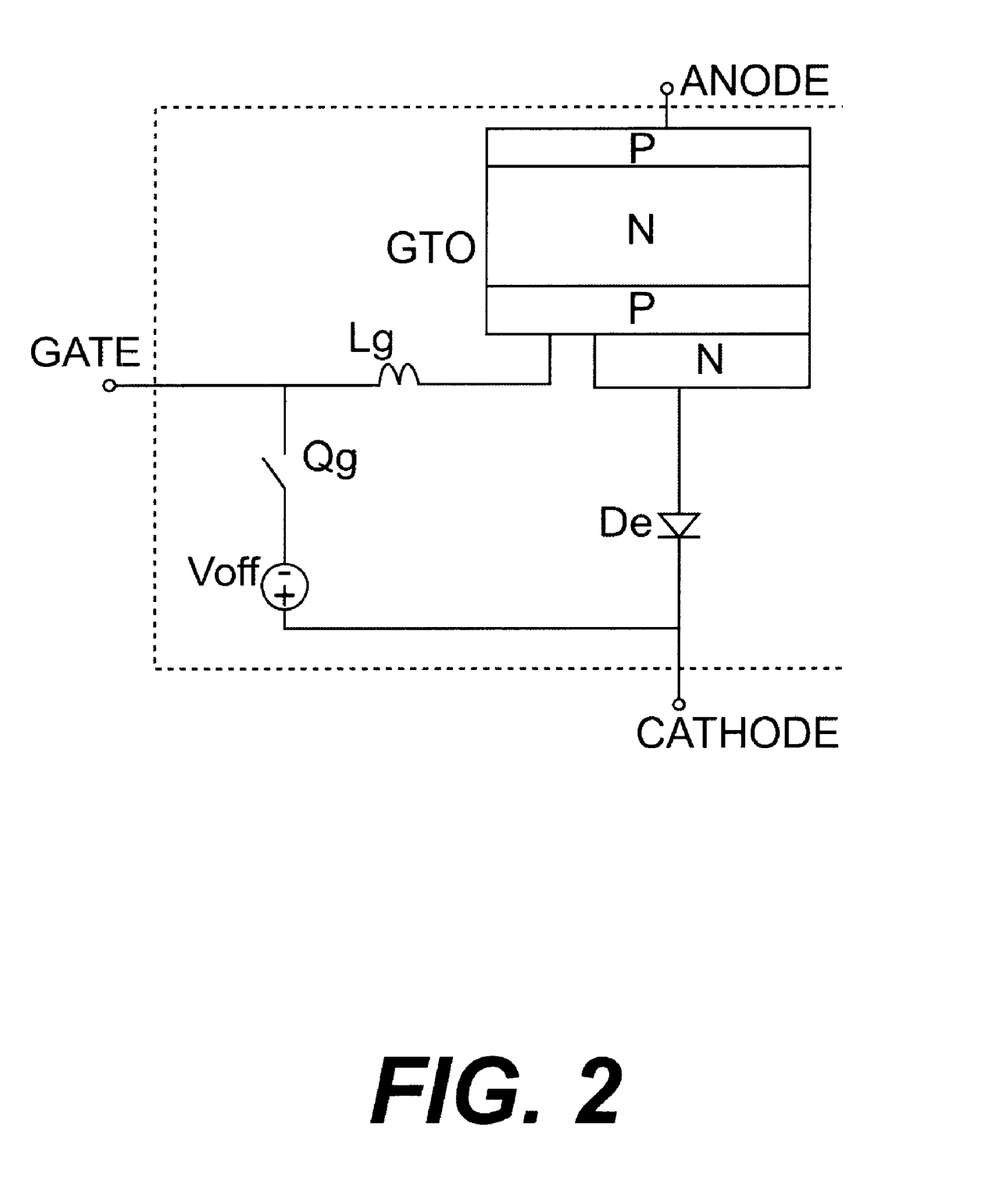
FIG. 2 is a diagram showing a thyristor circuit in accordance with one embodiment of the present invention.

Referring to FIG. 2, a gate turn-off thyristor circuit in accordance with a first embodiment of the present invention includes a gate turn-off thyristor GTO constructed from alternating layers of P- and N-type semiconductor material. Unlike the IGCT device of FIG. 1(a), a diode $D_E$ is connected in series with the gate turn-off thyristor GTO, an anode terminal A is connected to the GTO and a cathode terminal C is connected to the diode. Diode $D_E$ is part of a loop circuit which includes a voltage source $V_{OFF}$, a turn-off switch $Q_G$, and an inductor $L_G$ connected to one of the P-layers of the GTO. The breakdown voltage of the GTO gate-cathode diode is $V_{GC}$, the breakdown voltage of diode $D_E$ is $BV_E$, the turn-off voltage source is $V_{OFF}$, and the gate loop stray inductance is $L_G$.

Figure 3:
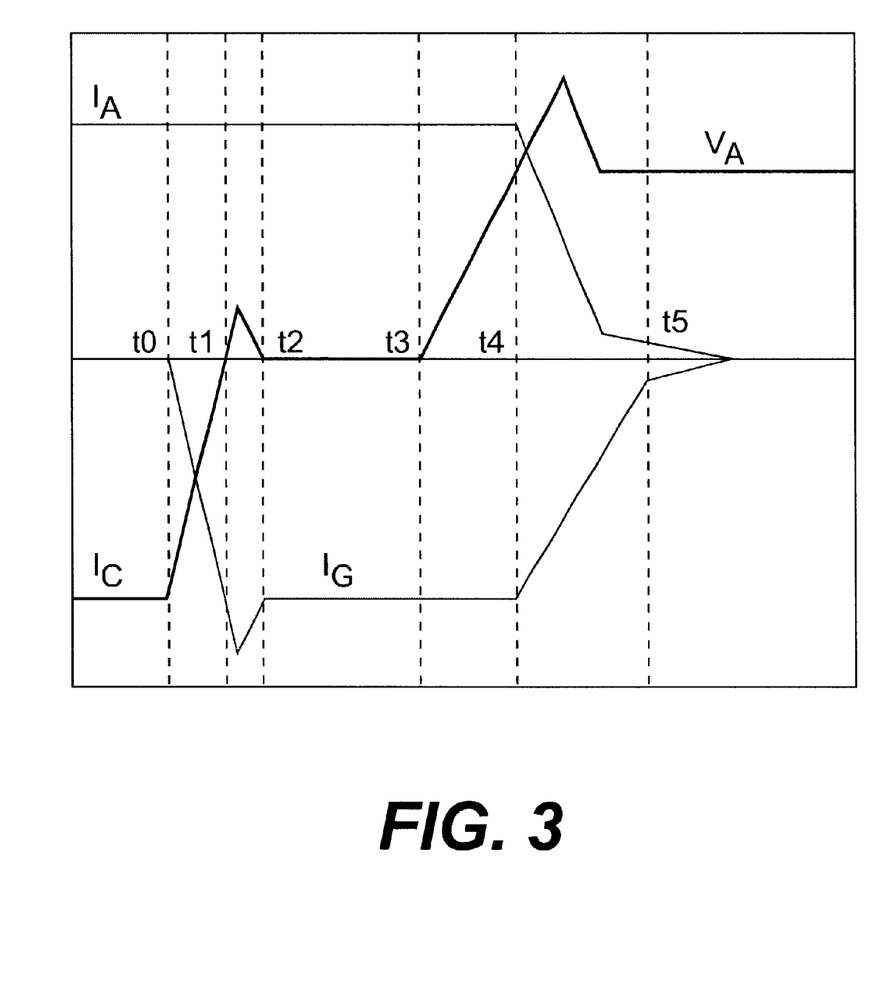
FIG. 3 is a graph showing waveforms corresponding to an anode current, anode voltage, cathode voltage, and gate current for the embodiment of the thyristor of FIG. 2.

FIG. 3 is a graph of waveforms corresponding to the expected anode current $I_A$, anode voltage $V_A$, cathode current $I_C$, and gate current $I_G$ of the circuit shown in FIG. 2. During a time period between $t_0$ and $t_1$, which corresponds to a turn-off transient, the turn-off switch $Q_G$ is turned on. As a result, the turn-off voltage source $V_{OFF}$ is applied on the gate loop stray inductance $L_G$ while $D_E$ and $D_{GC}$ are conducting. The turn-off current commutating rate may be expressed as:

$$di_G/dt = V_{OFF}/L_G$$

where the basic limitation of $V_{OFF}$ is $V_{OFF} < V_{GC} + V_{DE}$.

In this arrangement, since $D_E$ is a discrete diode its breakdown voltage can be selected to be very high. As a result, a very high value of the turn-off current commutation $di_G/dt$ can be achieved by using a higher value of $V_{OFF}$. This, in turn, allows the thyristor circuit of the present invention to achieve a maximum turn-off voltage well above the 20 volt level of conventional GTO thyristors, thereby achieving enhanced performance in terms of gate drive power reduction, fast turn-off transient, and snubberless turn-off capability.

Returning to FIG. 3, once the forward current in $D_E$ and $D_{GC}$ reaches zero, the GTO enters into the so-called unity turn-off condition. However, the current in inductor $L_G$ will keep increasing after t, until both diodes $D_{GC}$ and $D_E$ finish their reverse recovery and block voltage. To limit over-current commutation, a fast reverse recovery diode is preferably used for $D_E$. By the end of this reverse recovery process, at $t_2$, the current through the two diodes comes back and stays at zero before the end of the storage time. These diodes also serve to block the gate power supply voltage $V_{OFF}$.

At the end of the storage stage, $t_3$, the anode voltage begins to increase. At time $t_4$, the anode voltage reaches the DC link value and the anode current begins to decrease. The maximum gate current decay rate, which is determined by the gate loop parameters $V_{OFF}$, $V_{GC}$, $V_{DE}$, and $L_G$, may be slower than that of the anode current fall. Reverse breakdown will occur for both diodes $D_E$ and $D_{CG}$ until time $t_5$ when the gate current reaches the current tail level.

Based on the above analysis, it is clear that the gate turn-off thyristor circuit of the present invention realizes a higher turn-off current commutation rate compared with conventional GTO devices by making use of the diode $D_E$. Moreover, the unity turn-off gain is realized very quickly and can be maintained until the end of the turn-off transient process.

The thyristor circuit of the present invention can also be implemented in a very simple manner. By making use of a single diode die of a size equal to the GTO, the thyristor of the present invention may be made simply by stacking the two dies together and packaged inside a single press-pak (in accordance with a third embodiment of the invention). The component count is therefore low compared with ETO and MTO thyristor devices. Furthermore, because the press-pack diode has proven to be reliable over the long term, the reliability of the gate turn-off thyristor circuit of the invention will also be high. The forward voltage drop of this invention, however, will increase.

Design

The gate turn-off thyristor circuit of the present invention may be designed so that the minimum turn-off voltage is defined as $V_{off}=L_G*(dI_G/dt)$. Since the storage time of a GTO under the unity gain condition is typically less than 1 μsec, the $dI_g/dt$ has to be high enough so that the gate current is equal to or higher than the anode current within 1 μsec. For example, to turn-off 6 kA, the $dI_g/dt$ has to be higher than 6 kA/μs. With certain margins, a $dI_g/dt$ of 8 kA/μs is needed. If the loop inductance is 30 nH, this would require a $V_{OFF}$ of $V_{OFF}$=0.02 μH * 8 kA/μs=160 V. This high voltage can be used in the present invention but not the conventional GTO or $I_G$ CT because it is beyond the limits of a GTO's gate-to-cathode breakdown voltage, $BV_{GC}$.

The design of the breakdown voltage $BV_E$ of diode $D_E$ is very important to the snubberless turn-off capability of the thyristor of the invention. First, the condition $BV_E + BV_{GC} > V_{OFF}$ has to be met so that the power supply $V_{OFF}$ does not constantly break down the gate-cathode junction of the newly invented device. However, selecting a too high $BV_E$ is not desirable.

Simulation results show that if $BV_E$ is higher than the turn-off voltage $V_{OFF}$, an effective forward gate current injection, which attempts to turn the GTO on while its voltage is rising, is presented after the unity-gain has already been established. This kind of effective current injection is detrimental to the snubberless switched GTO, because of the interaction which takes place within the gate current commutation loop.

Figure 4:
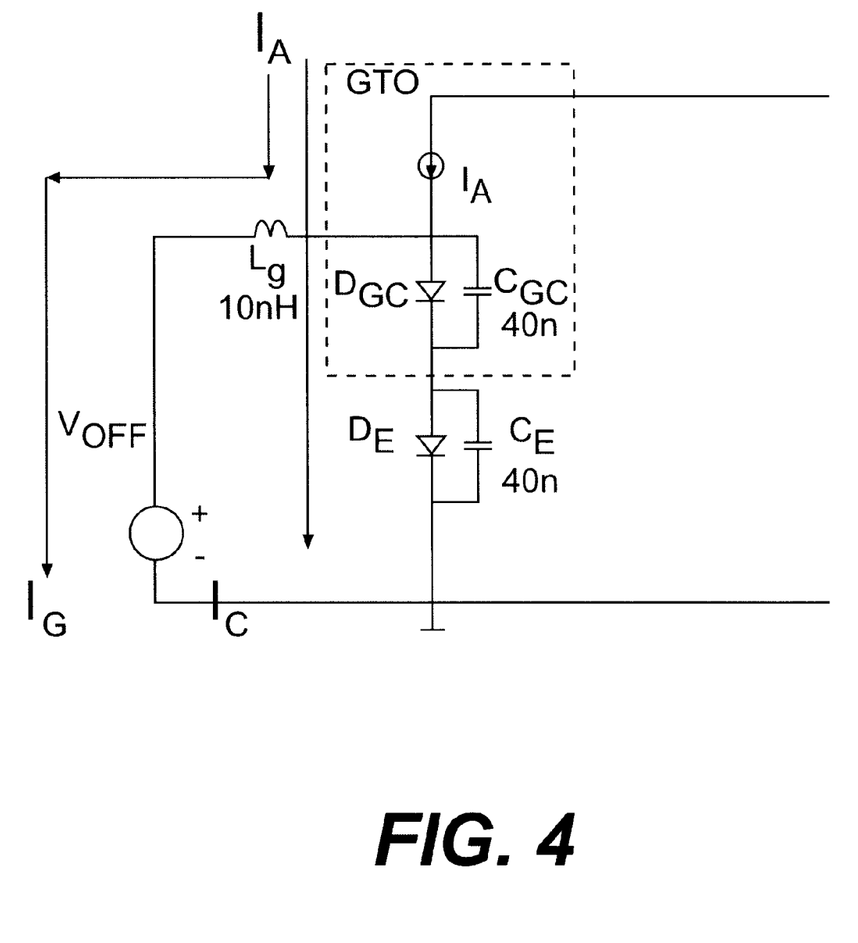
FIG. 4 is a diagram of a simulation equivalent circuit for the turn-off transient of the thyristor of the present invention.
Figure 5:
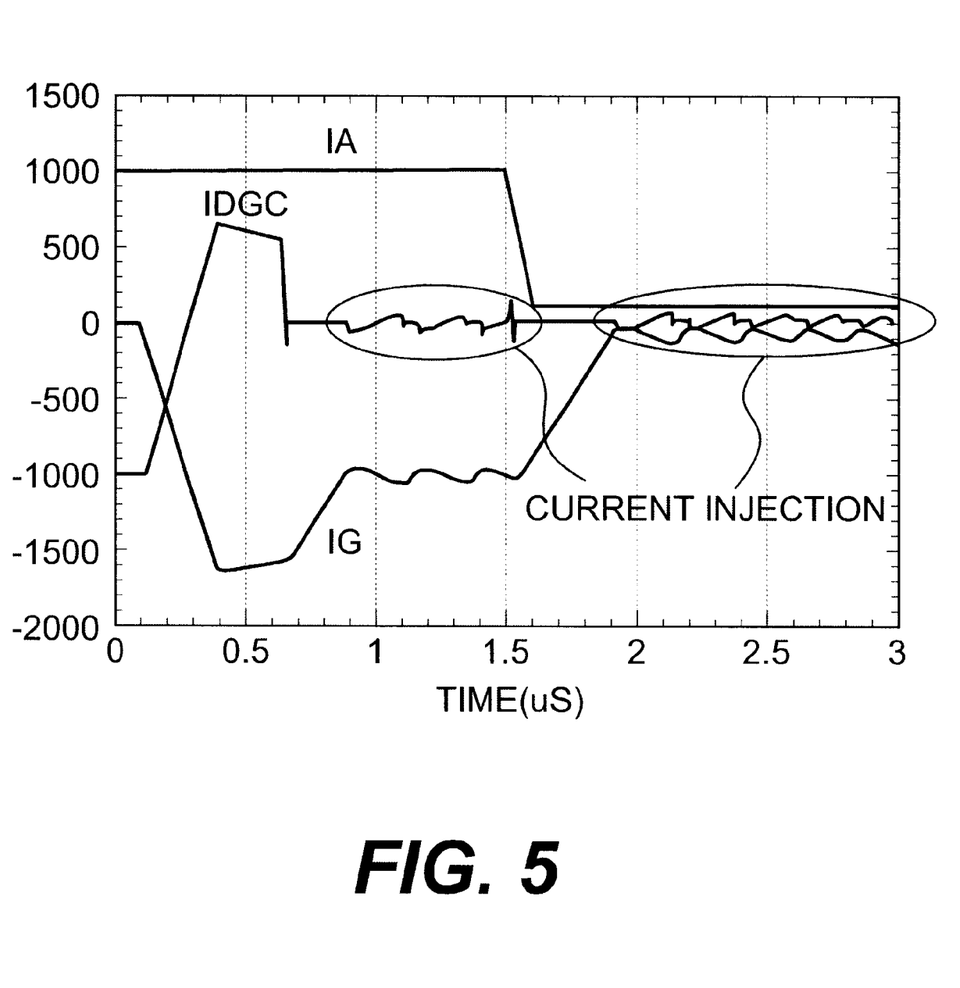
FIG. 5 is a graph showing simulation results obtained for a simulation of the thyristor of the present invention, wherein an unexpected current injection occurs during the turn-off transient.

FIG. 4 shows an equivalent circuit used for Pspice simulation when a 60 volt $D_E$ and a 55 volt turn-off power supply $V_{OFF}$ are used. Serious current injection into the GTO emitter diode $D_{GC}$ is found both before and after the anode current fall. FIG. 5 shows simulation results of the circuit shown in FIG. 4.

Referring to FIG. 5, when all the cathode current is commutated to the GTO gate (i.e., unity-gain is established), $D_E$ and $D_{GC}$ enter into reverse recovery mode. In their recovery stage, the turn-off voltage source $V_{OFF}$ will build an opposite current into the GTO cathode and extra energy in $L_G$. Because diode $D_E$ is designed with a shorter reverse recovery time than $D_{GC}$ to avoid excess reverse current being built in $D_{GC}$, diode $D_E$ will recover earlier and block $V_{OFF}$. Since $V_{OFF}$ is less than $BV_E$, the extra energy in $L_G$ will now be discharged by transferring to the junction capacitance $C_{DE}$ of $D_E$ and breaking it down. The gate current begins to decrease at a rate of:

$$dI_G/dt=(BV_E-V_{OFF})/L_G$$

After a while, the GTO gate-cathode diode will also be recovered and will breakdown as well due to $L_G$ energy. The maximum gate current decreasing rate will be:

$$dI_G/dt=(BV_E+BV_G-V_{OFF})/L_G$$

This $dI_G/dt$ is much higher than the previous one and brings the gate current to the anode current level rapidly, as shown in FIG. 5. After the extra energy in $L_G$ is discharged (at this time $I_G=I_A$ again), the extra energy stored in $D_{GC}$ and $C_{DE}$ will discharge in the opposite direction (forward direction), and could complete discharge $C_{DGC}$ if the extra voltage on $D_{GC}$ when it breaks down is more than half of $BV_{GC}$ (one can view this as an oscillation process between LG-CDGC-CDE). If this happens, an effective forward injecting current exists in the GTO via $D_{GC}$ (i.e., the emitter junction of the GTO). A similar transient process with a forward injection will also occur during the anode current fall (see FIG. 5). This is also caused by energy stored in $L_G$ and the oscillation between LG-$C_{GC}$-$C_{DE}$. These injections will cause device turn-off failure and the device will be destroyed.

By designing $BV_E$ lower than $V_{OFF}$, so that $BV_{GC}/2+BV_E<V_{OFF}$, the effective current injection problem can be solved because the reverse biased GC junction will never be fully discharged during any LG-$C_{GC}$-$C_{DE}$ oscillation..

Figure 6:
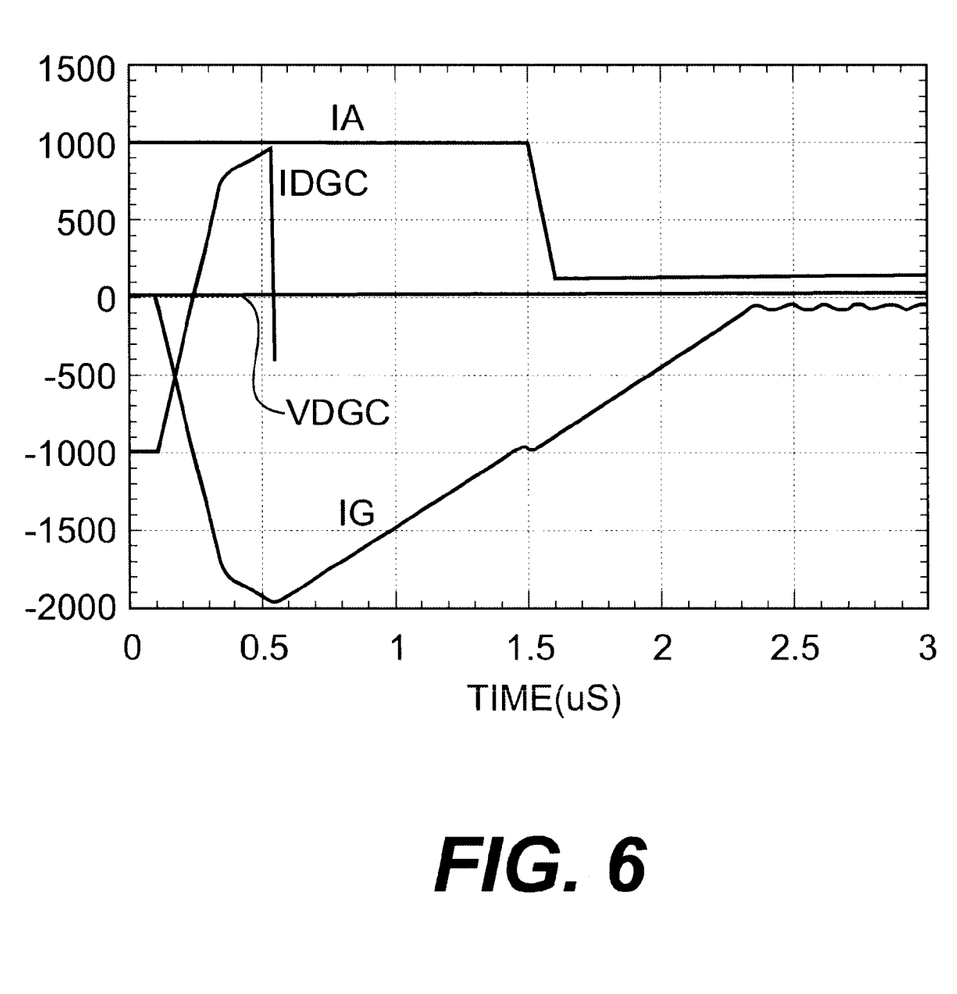
FIG. 6 is a graph showing simulation results wherein the current injection disappears by selecting the turn-off voltage $V_{OFF}$ to be higher than the breakdown voltage $D_E$.

FIG. 6 shows simulation results when the turnoff voltage $V_{OFF}$ is increased to 70 volts. The current in $D_{GC}$ does not flow forward once it is commutated. The voltage across this junction $V_{DGC}$ remains negative also. This ensures that the GTO will always operate in the open-base PNP mode with no thyristor action. Large voltage can therefore be established across the GTO without failure. This will therefore ensure the large turn-off SOA achieved by the present invention. Moreover, the device of the present invention with no forward injection can therefore conduct turn-off without any dV/dt snubber. This is also called snubberless turn-off capability.

Experimental Demonstration

Figure 7A:
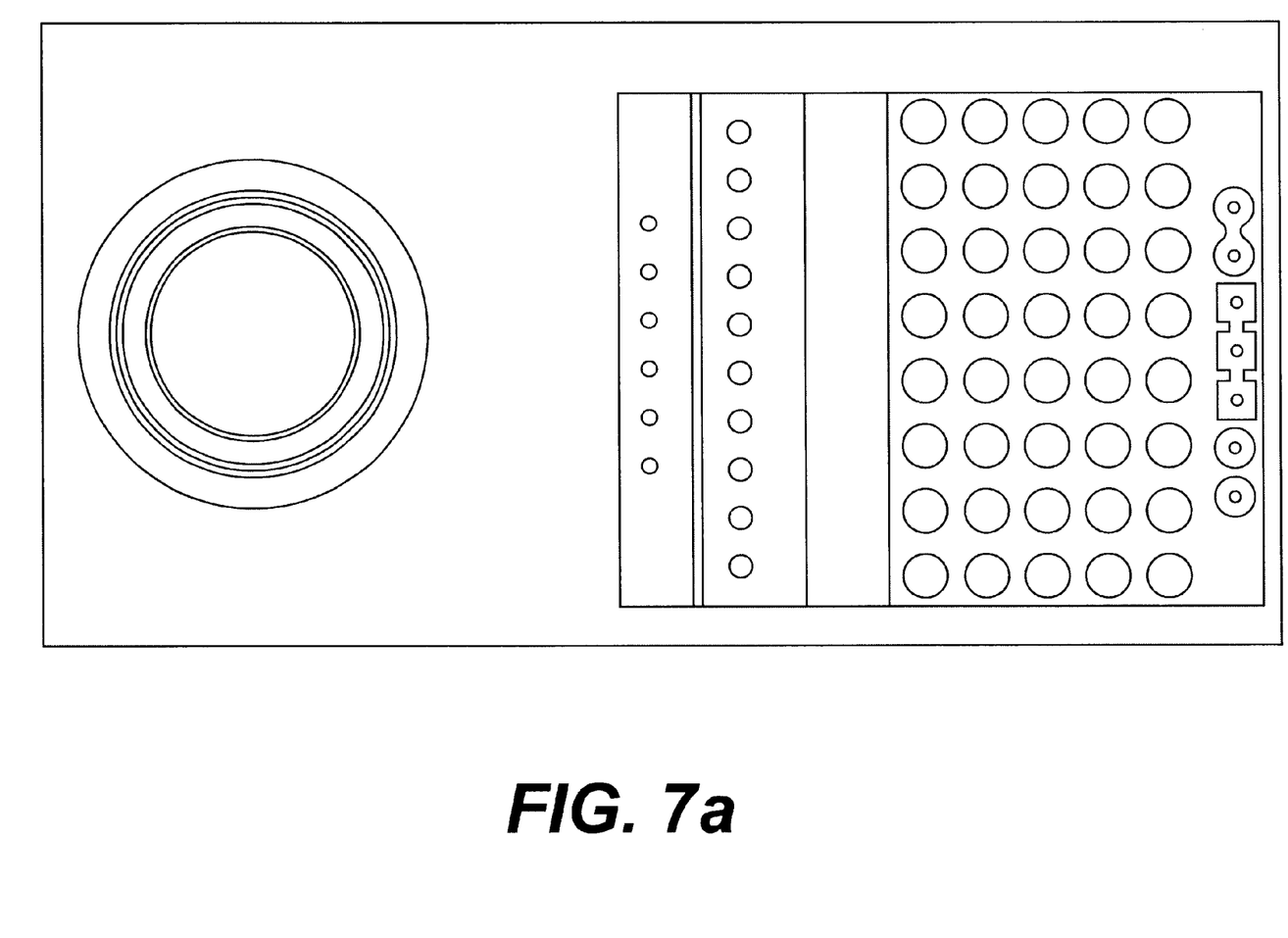
FIG. 7(a) is a photograph showing a prototype thyristor constructed in accordance with a second embodiment of the present invention.
Figure 7B:
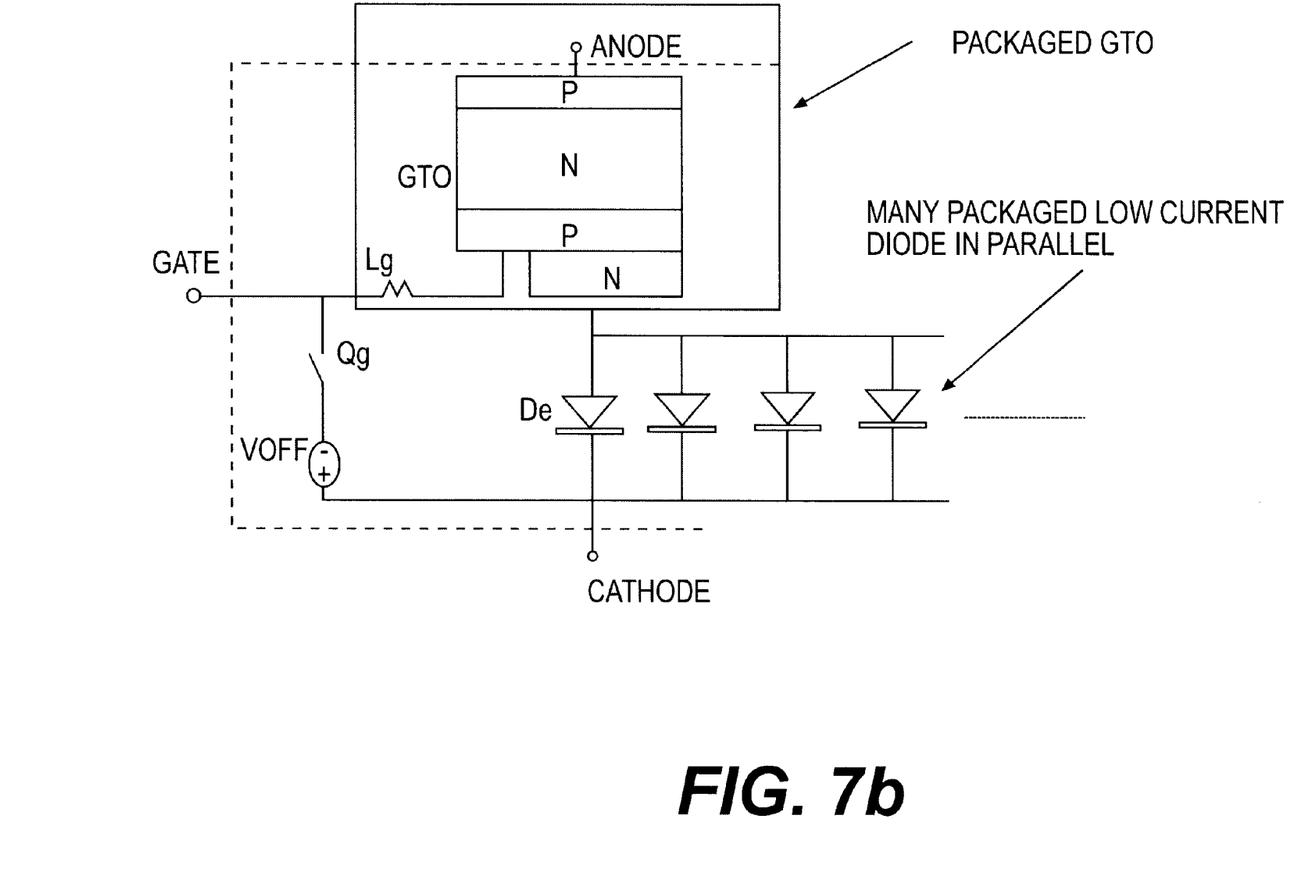
FIG. 7(b) is a schematic diagram of the circuit shown in FIG. 7(a).

An experimental gate turn-off thyristor circuit in accordance with a second embodiment of the present invention was developed, as shown in FIG. 7(a), based on the aforementioned principles. The diode $D_E$ in this circuit was implemented by paralleling two or more discrete diodes, as schematically shown in FIG. 7(b). The GTO was a 53 mm 1.0 kA/4.5 kV device manufactured by Westcode Semiconductor. The breakdown voltage of $D_E$ was 55 volts, and the turn-off voltage $V_{OFF}$ was 60 volts. Once the GTO was turned off under the unity turn-off gain condition, the uniformity of the current distribution was guaranteed. Theoretical and experimental results showed that the turn-off capability of the GTO was limited only by the dynamic breakdown, which was about 200–300 kW/cm². This ensured the snubberless turn-off capability of the thyristor circuit of the invention.

Figure 8:
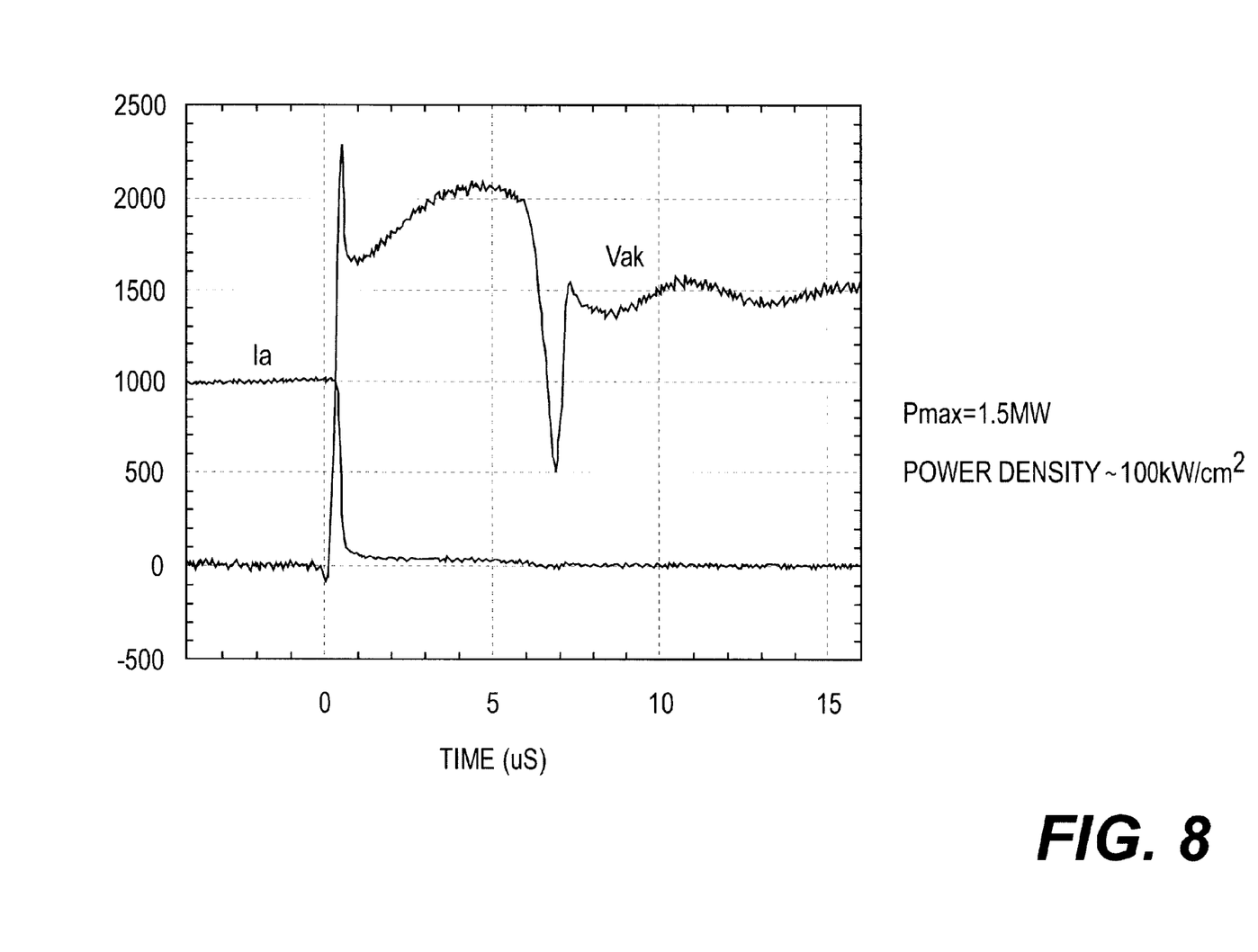
FIG. 8 is a graph showing snubberless turn-off waveforms obtained in accordance with the prototype thyristor of the present invention.

FIG. 8 shows the snubber less turn-off waveform of the thyristor at 0.8 kA, 1.5 kV DC link voltage. As these results show, the GTO's gate and cathode voltage waveform can be used to estimate the turn-off current commutation rate $di_G/dt$ and the gate loop stray inductance $L_G$.

Figure 9:
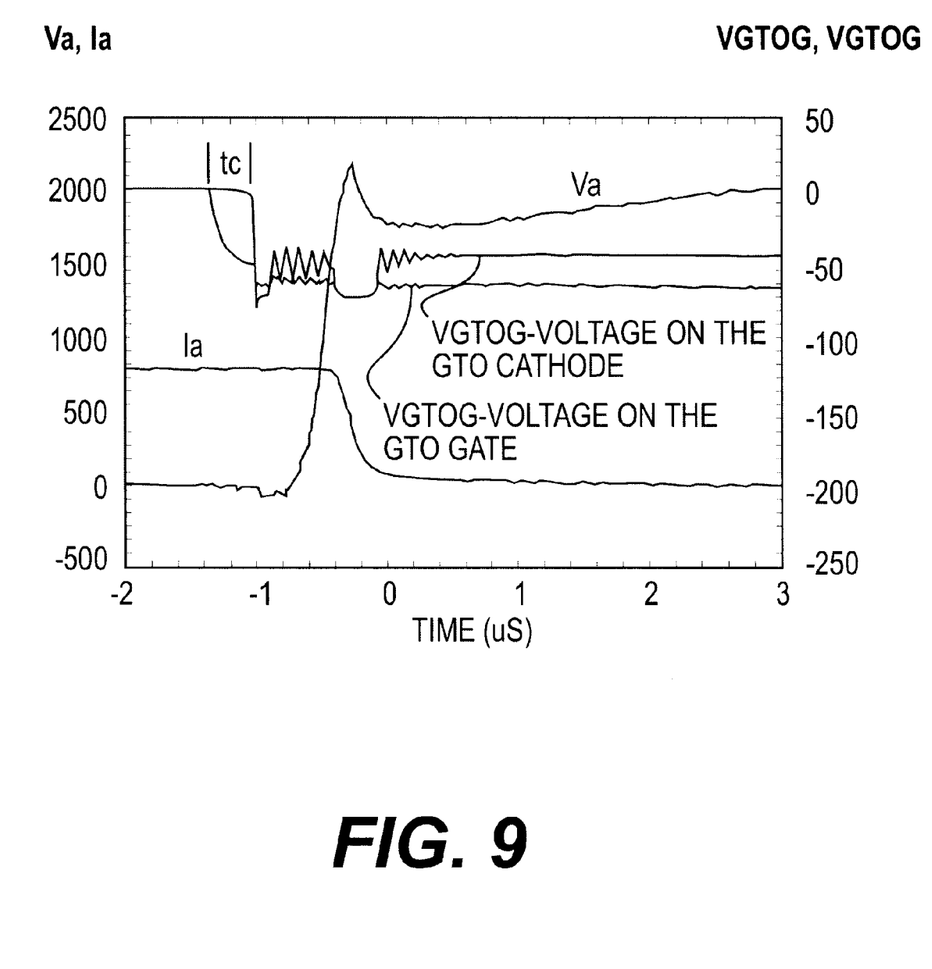
FIG. 9 is a graph showing voltages obtained for the thyristor of the present invention during the turn-off transient.

FIG. 9 shows voltage values obtained by the thyristor circuit of the present invention during the turn-off transient. The experimental circuit discussed above demonstrated that a much higher turn-off voltage $V_{OFF}$ can be used for current commutation than that of a $I_G$ CT. In conjunction with a reduction in the gate loop stray inductance, the current commutation rate of the thyristor circuit of the invention can be much higher than 6 kA/$\mu$sec. IGCT requires 3 nH construction to obtain 6 kA/us current commutation rate. Since reducing inductance is not easy and economical, the present invention allows the same commutation rate to be achieved with must higher stray inductance. For example, if $L_G$=15 nH, the present invention can still obtain 6 kA/us by using $V_{OFF}$=90 V.

Figure 10A:
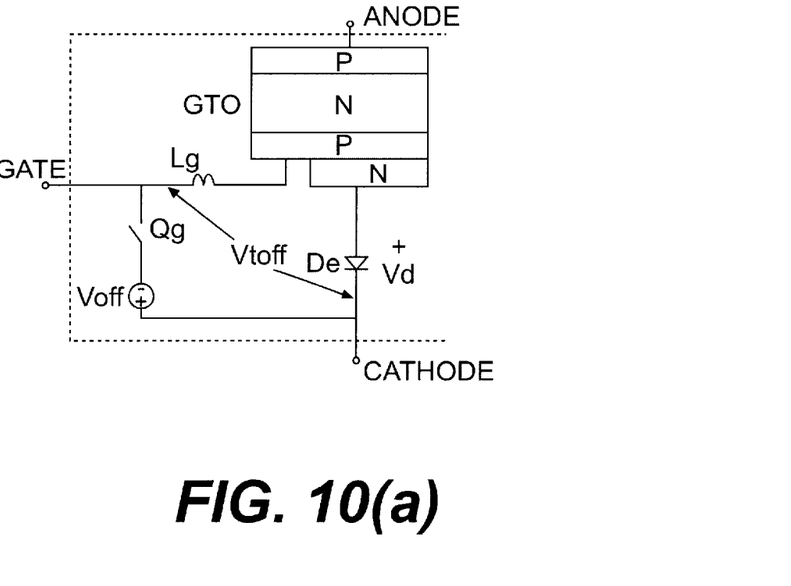
FIGS. 10(a)–(d) are circuit diagrams and additional graphs of internal voltage waveforms obtained during the turn-off transient.

FIGS. 10(a)–(d) are circuit diagrams and additional graphs of internal waveforms obtained during the turn-off transient. FIGS. 10(a) and (b) define the voltage $Vt_{off}$ and $V_d$ as measured by an oscilloscope. Since most of the gate loop inductance $L_G$ is inside the GTO package, $Vt_{off}$ includes the voltage on most of $L_G$. At time $t=t_{12}$, diode $D_E$ has recovered and the gate current commutation rate changes to that given by $dI_G/dt=(BV_{DE}-V_{OFF})/L_G$.

Figure 10B:
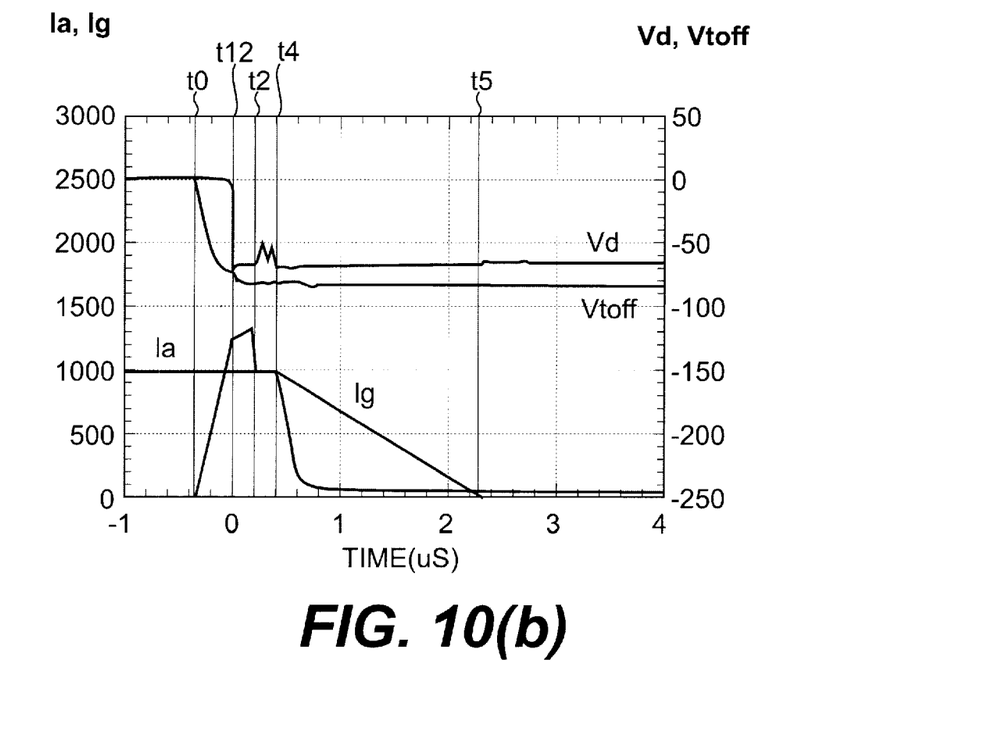

At time $t=t_2$, diode $D_{GC}$ (GTO's emitter junction) has recovered and broken down. This brings down the gate current to the anode current level.

A bump in $V_d$ from $t_2$ to $t_4$ is due to the discharge of $C_{DE}$ (hence $C_{DGC}$ as well) in the forward direction (this is the cause of the possible forward injection). However, in this case, the discharge of $C_{DE}$ and $C_{GC}$ (not shown in the diagram) is not enough to forward bias $D_{GC}$.

From $t_4$ to $t_5$, GTO emitter junction is in breaking down again to allow energy in $L_G$ to be discharged. The DC voltage difference between $Vt_{OFF}$ and $V_d$ is the reverse voltage applied to the GTO's emitter junction.

Figure 10C:
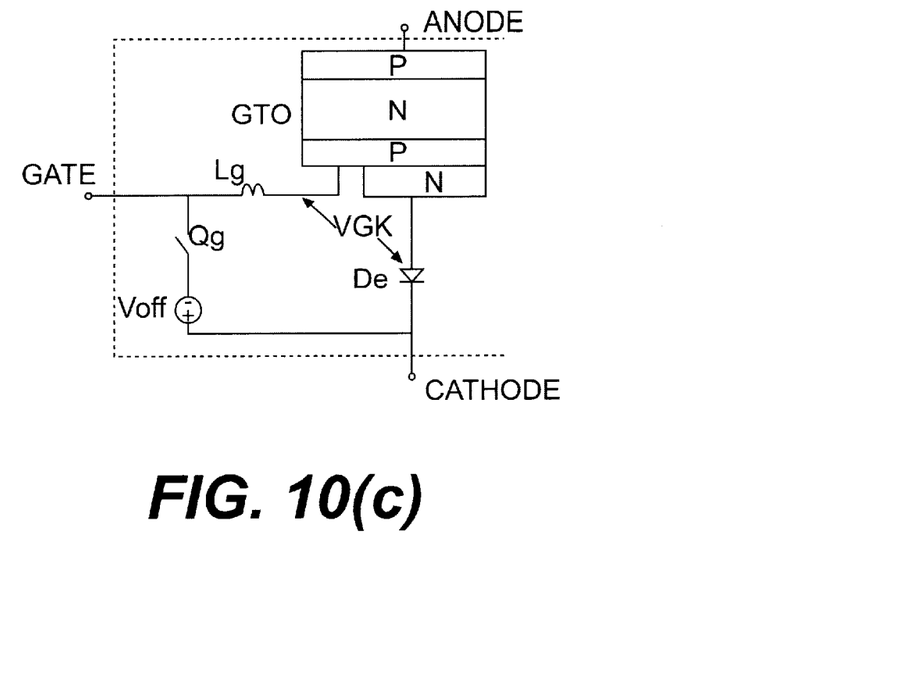
Figure 10D:
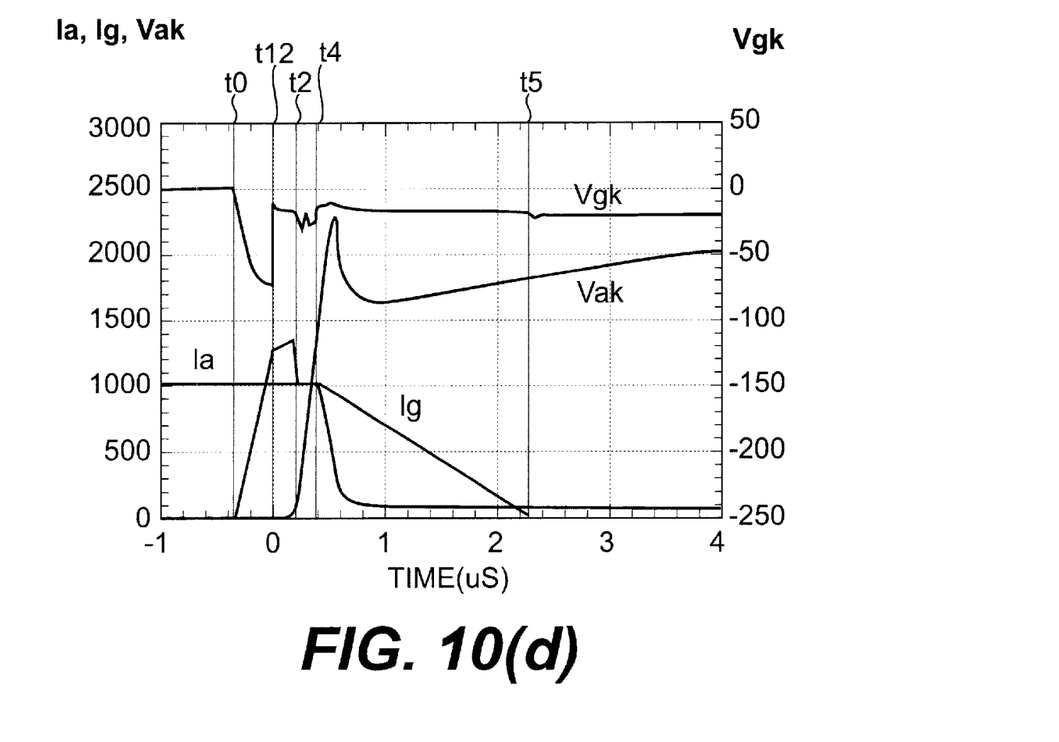

FIG. 10(c) shows the definition of $V_{gk}$ ($V_{gk}=Vt_{OFF}-V_d$) as measured by an oscilloscope that is shown in FIG. 10(d). Before time $t_{12}$, the high voltage $V_{gk}$ represents voltage applied to $L_G$ for rapid commutation to achieve unity turn-off gain. This voltage drops quickly as soon as the diode $D_E$ recovers at time $t_{12}$. After time $t_{12}$, a constant voltage close to 20 V is applied to the GTO's GC junction (plus part of $L_G$) which ensures reverse biasing of the GTO.

Six-inch GTOs have been commercialized for several years, having more than twice the die area of 4-inch devices. However, a 6-inch device is not expected to switch twice as much as the 4-inch IGCT. There are two reasons for this. The first is that the gate driver cannot supply a high enough current commutation rate (12 kA/$\mu$sec) to ensure the unit turn-off gain. The second relates to the uniformity of the turn-off transient process. An even higher current commutation rate is needed to avoid current crowding in 6-inch IGCTs. The principles embodied in the thyristor of the present invention may be used to achieve this goal. For a six-inch GTO, the gate loop inductance is expected to be between 15 nH and 20 nH if a design similar to FIG. 7(a) is used. To achieve a 12 kA/us commutation rate, it may be preferably to use $V_{OFF}$=180 V and a diode with $BV_E$=170 V.

Figure 11:
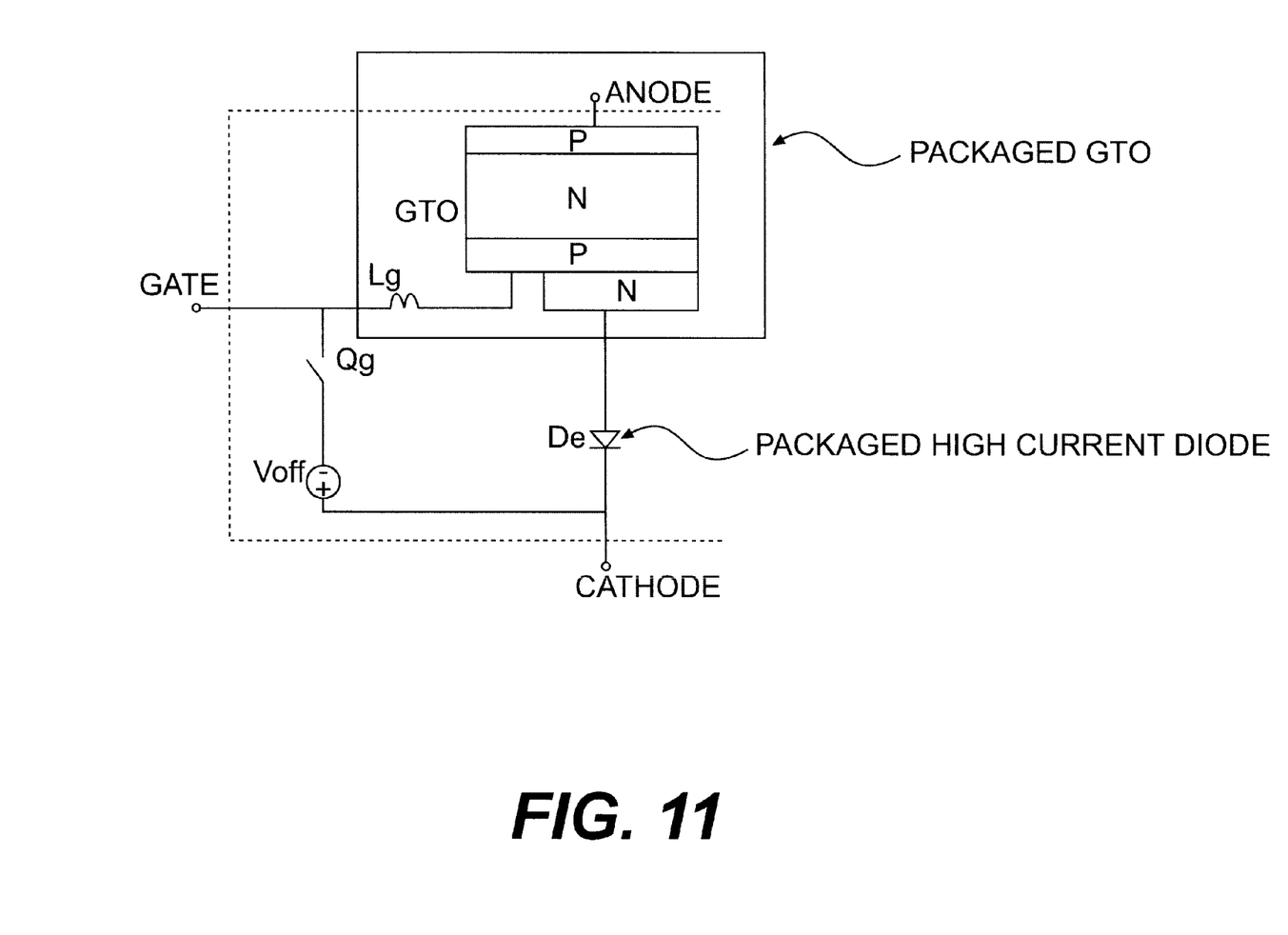
FIG. 11 is a diagram of how the thyristor of the present invention may be packaged.

FIG. 11 shows the thyristor of the present invention using a packaged GTO in series with a single packaged diode.

Figure 12:
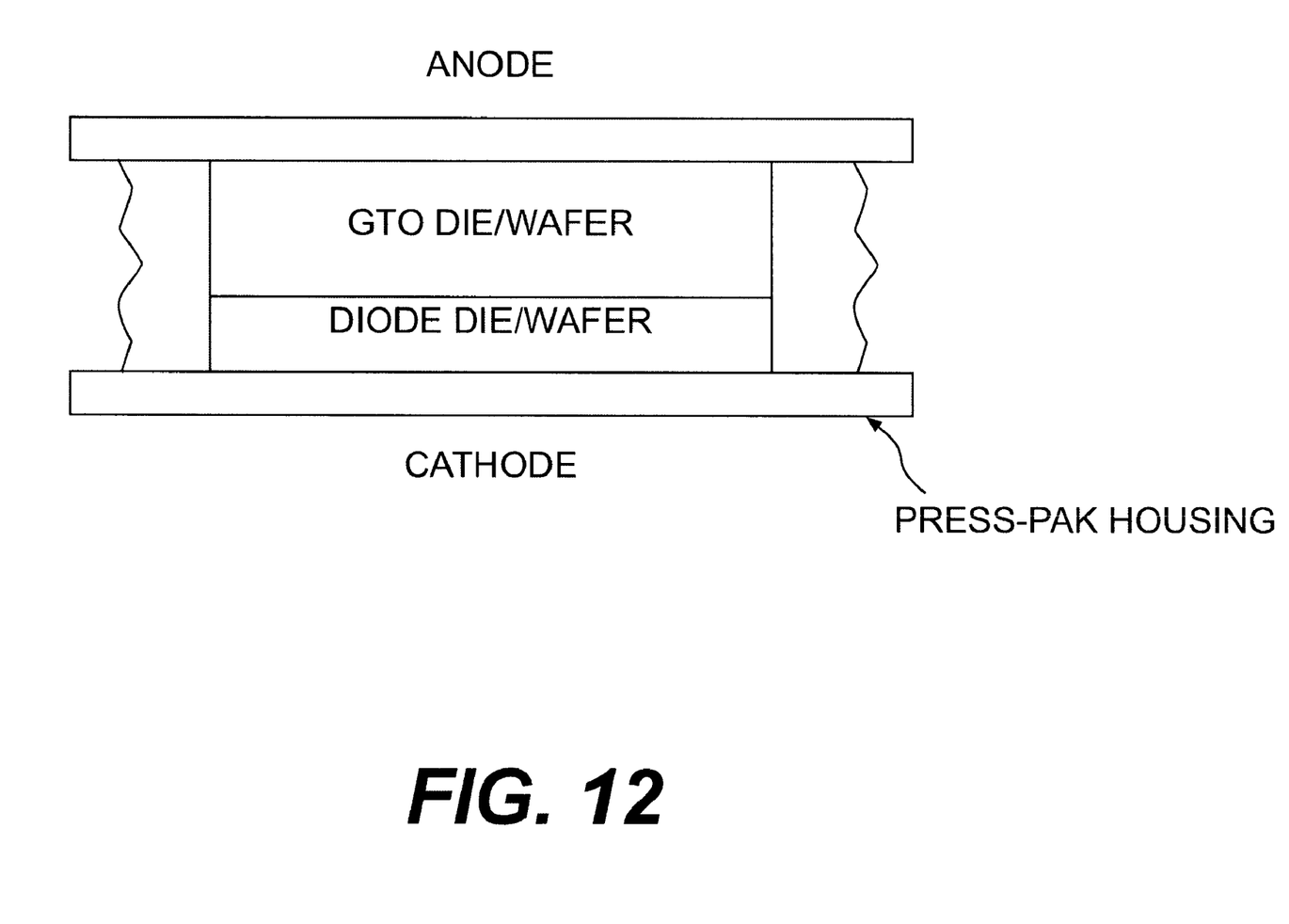
FIG. 12 shows how a third embodiment of the thyristor circuit of the present invention may be packaged.

FIG. 12 shows how a third embodiment of the thyristor circuit of the present invention may be packaged. In this embodiment, a GTO die/wafer and a diode die/wafer are stacked and combined in a press-pak housing, with the anode and cathode terminals above and below the package.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

What is claimed is:

1. A gate turn-off thyristor circuit having an anode and a cathode, comprising:
    a gate turnoff thyristor connected to said anode;
    a diode connected in series with said gate turn-off thyristor in a cathode current path and said cathode;
    a turn-off voltage source connected to said diode; and
    a gate loop stray inductance element connected between said turn-off voltage and said gate turn-off thyristor,
    wherein a turn-off current commutating rate of said gate turn-off thyristor is based on a breakdown voltage of said diode.

2. The thyristor circuit of claim 1, wherein said diode is a discrete diode.

3. The thyristor circuit of claim 1, wherein said diode is a fast reverse recovery diode.

4. The thyristor circuit of claim 1, wherein a unity turn-off gain of said circuit is maintained by said diode until a turn-off transient process.

5. The thyristor circuit of claim 1, wherein the breakdown voltage of said diode allows said turn-off voltage source to have a turn-off voltage that ensures snubberless switching of said gate turn-off thyristor.

6. The thyristor circuit of claim 5, wherein said turn-off voltage $V_{OFF}$ is selected to satisfy the following relation: $BV_E+BV_{GC}>V_{OFF}$, wherein $BV_E$ is the breakdown voltage of said diode and $BV_{GC}$ is a gate-to-cathode breakdown voltage.

7. The thyristor circuit of claim 5, wherein the breakdown voltage of said diode $BV_E$ is less than said turn-off voltage $V_{OFF}$, so that a sum of a gate-to-cathode breakdown voltage $BV_{GC}/2$ and the breakdown voltage of said diode $BV_E$ is less than said turn-off voltage $V_{OFF}$.

8. The thyristor circuit of claim 1, wherein a turn-off voltage $V_{OFF}$ of said voltage source is of a level where current through an internal diode of the gate turn-off thyristor $D_{GC}$ does not flow forward once commutated.

9. The thyristor circuit of claim 1, wherein said diode has a single diode die of a size equal to said gate turn-off thyristor.

10. The thyristor circuit of claim 1, wherein said diode is packaged inside a single press-pak with said gate turn-off thyristor.

11. A gate turn-off thyristor circuit having an anode and a cathode comprising:
    a gate turn-off thyristor connected to said anode;
    a plurality of parallel-connected diodes between said gate turn-off thyristor in a cathode current path and said cathode;
    a turn-off voltage source connected to said plurality of diodes; and a gate loop stray inductance element connected between said turn-off voltage and said gate turn-off thyristor;

wherein said plurality of diodes form a diode element having a breakdown voltage, and wherein a turn-off current commutating rate of said gate turn-off thyristor is based on the breakdown voltage of said diode element.

12. A method for performing snubberless switching of a gate turn-off thyristor circuit, said circuit including an anode and a cathode, comprising:

connecting a gate turn-off thyristor to said anode;

connecting a diode in series with said gate turn-off thyristor in a cathode current path and said cathode;

connecting a turn-off voltage source to said diode;

connecting a gate loop stray inductance element between said turn-off voltage and said gate turn-off thyristor; and increasing a turn-off current commutating rate of said gate turn-off thyristor by increasing a breakdown voltage of said diode.

13. The method of claim 12, further comprising:

maintaining a unity turn-off gain of said circuit until a turn-off transient process.

14. The method of claim 12, further comprising:

selecting said turn-off voltage $V_{OFF}$ to satisfy the following relation: $BV_E + BV_{GC} > V_{OFF}$, wherein $BV_E$ is the breakdown voltage of said diode and $BV_{GC}$ is a gate-to-cathode breakdown voltage.

15. The method of claim 12, further comprising:

setting the breakdown voltage of said diode $BV_E$ to be less than said turn-off voltage $V_{OFF}$, so that a sum of a gate-to-cathode breakdown voltage $BV_{GC}/2$ and the breakdown voltage of said diode $BV_E$ is less than said turn-off voltage $V_{OFF}$.

16. The method of claim 12, further comprising:

setting a turn-off voltage $V_{OFF}$ of said voltage source to a level where current through an internal diode of the gate turn-off thyristor $D_{GC}$ does not flow forward once commutated.

* * * * *